(12) United States Patent
Behrends et al.

(10) Patent No.: US 7,911,827 B2
(45) Date of Patent: Mar. 22, 2011

(54) IMPLEMENTING ENHANCED SRAM STABILITY AND ENHANCED CHIP YIELD WITH CONFIGURABLE WORDLINE VOLTAGE LEVELS

(75) Inventors: Derick Gardner Behrends, Rochester, MN (US); Travis Reynold Hebig, Rochester, MN (US); Daniel Mark Nelson, Rochester, MN (US); Jesse Daniel Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 12/360,242

(22) Filed: Jan. 27, 2009

(65) Prior Publication Data

US 2010/0188886 A1    Jul. 29, 2010

(51) Int. Cl.
*G11C 11/00* (2006.01)
(52) U.S. Cl. .............. 365/154; 365/230.06; 365/189.11; 365/201; 365/230.08; 365/189.05

(58) Field of Classification Search .................. 365/154, 365/230.06, 189.11, 201, 230.08, 189.05
See application file for complete search history.

(56) References Cited

U.S. PATENT DOCUMENTS

2007/0030741 A1*  2/2007  Nii et al. .................. 365/189.11
2008/0253172 A1*  10/2008  Yamagami .................... 365/154

* cited by examiner

*Primary Examiner* — Thong Q Le
(74) *Attorney, Agent, or Firm* — Joan Pennington

(57) ABSTRACT

An array built in self test (ABIST) method and circuit for implementing enhanced static random access memory (SRAM) stability and enhanced chip yield using configurable wordline voltage levels, and a design structure on which the subject circuit resides are provided. A wordline is connected to a SRAM memory cell. A plurality of wordline voltage pulldown devices is connected to the wordline. A respective wordline voltage control input signal is applied to each of the plurality of wordline voltage pulldown devices to selectively adjust the voltage level of the wordline.

18 Claims, 3 Drawing Sheets

US 7,911,827 B2

IMPLEMENTING ENHANCED SRAM STABILITY AND ENHANCED CHIP YIELD WITH CONFIGURABLE WORDLINE VOLTAGE LEVELS

FIELD OF THE INVENTION

The present invention relates generally to the data processing field, and more particularly, relates to an array built in self test (ABIST) method and circuit for implementing enhanced static random access memory (SRAM) stability and enhanced chip yield using configurable wordline voltage levels, and a design structure on which the subject circuit resides.

DESCRIPTION OF THE RELATED ART

As technology scales, static random access memory (SRAM) cell variation is becoming increasingly problematic. In high speed memories, balancing the conflicting cell tuning requirements for read stability and writeability is also increasingly difficult.

Due to the sensitivity of the SRAM designs, process variation can greatly reduce yields. Variation in dopant levels can increase or decrease device threshold voltages and skew the sensitive device strength ratios in the SRAM cell. This variation can cause the SRAM cell to be unstable or unwriteable.

The SRAM cell can become unstable when process varies such that the pass gate voltage threshold (Vt) is decreased. This makes the pass gate stronger and skews the sensitive beta ratio of the pass gate current to the pulldown device current.

There is a need for a method and circuit to adjust this beta ratio after manufacturing, thus improving static random access memory (SRAM) stability and chip yields.

SUMMARY OF THE INVENTION

Principal aspects of the present invention are to provide an array built in self test (ABIST) method and circuit for implementing enhanced static random access memory (SRAM) stability and enhanced chip yield using configurable wordline voltage levels and a design structure on which the subject circuit resides. Other important aspects of the present invention are to provide such method, circuit and design structure substantially without negative effect and that overcome many of the disadvantages of prior art arrangements.

In brief, an array built in self test (ABIST) method and circuit for implementing enhanced static random access memory (SRAM) stability and enhanced chip yield using configurable wordline voltage levels, and a design structure on which the subject circuit resides are provided. A wordline is connected to a SRAM memory cell. A plurality of wordline voltage pulldown devices is connected to the wordline. A respective wordline voltage control input signal is applied to each of the plurality of wordline voltage pulldown devices to selectively adjust the voltage level of the wordline.

In accordance with features of the invention, the SRAM circuit and method improves chip yields by correcting for process variation after manufacturing. The SRAM circuit and method adjusts the sensitive current ratio of pass gate to pulldown device via a configurable wordline voltage level.

In accordance with features of the invention, an Array Built In Self Test (ABIST) method is provided using the SRAM circuit to reduce SRAM cell stability fails. Cell stability ABIST patterns are run with a maximum wordline voltage. Responsive to identified stability fails, the wordline voltage is adjusted to the next lower level and cell stability ABIST patterns are run. Responsive to any identified stability fails, the wordline voltage is adjusted to the next lower level. When no stability fails are identified, checking cell performance is performed. Responsive to the cell meeting performance without stability ABIST fails, the wordline voltage level setting is recorded. The wordline voltage level setting is used in a functional mode of the SRAM cell.

In accordance with features of the invention, the SRAM circuit includes a plurality of wordline voltage control latches having an ABIST interface for running ABIST tests and an input for receiving the wordline voltage level setting. The plurality of wordline voltage control latches provides a respective gate input to weak N-channel field effect transistors (NFETs) implementing the wordline voltage pulldown devices.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a static random access memory (SRAM) circuit to adjust wordline voltage level and an Array Built In Self Test (ABIST) method using this circuit to reduce SRAM cell stability fails are provided. This SRAM circuit and ABIST method improves chip yields by correcting for process variation after manufacturing. The SRAM circuit and ABIST method adjusts the sensitive SRAM cell current ratio of pass gate to pulldown device via a configurable wordline voltage level.

Figure 1:
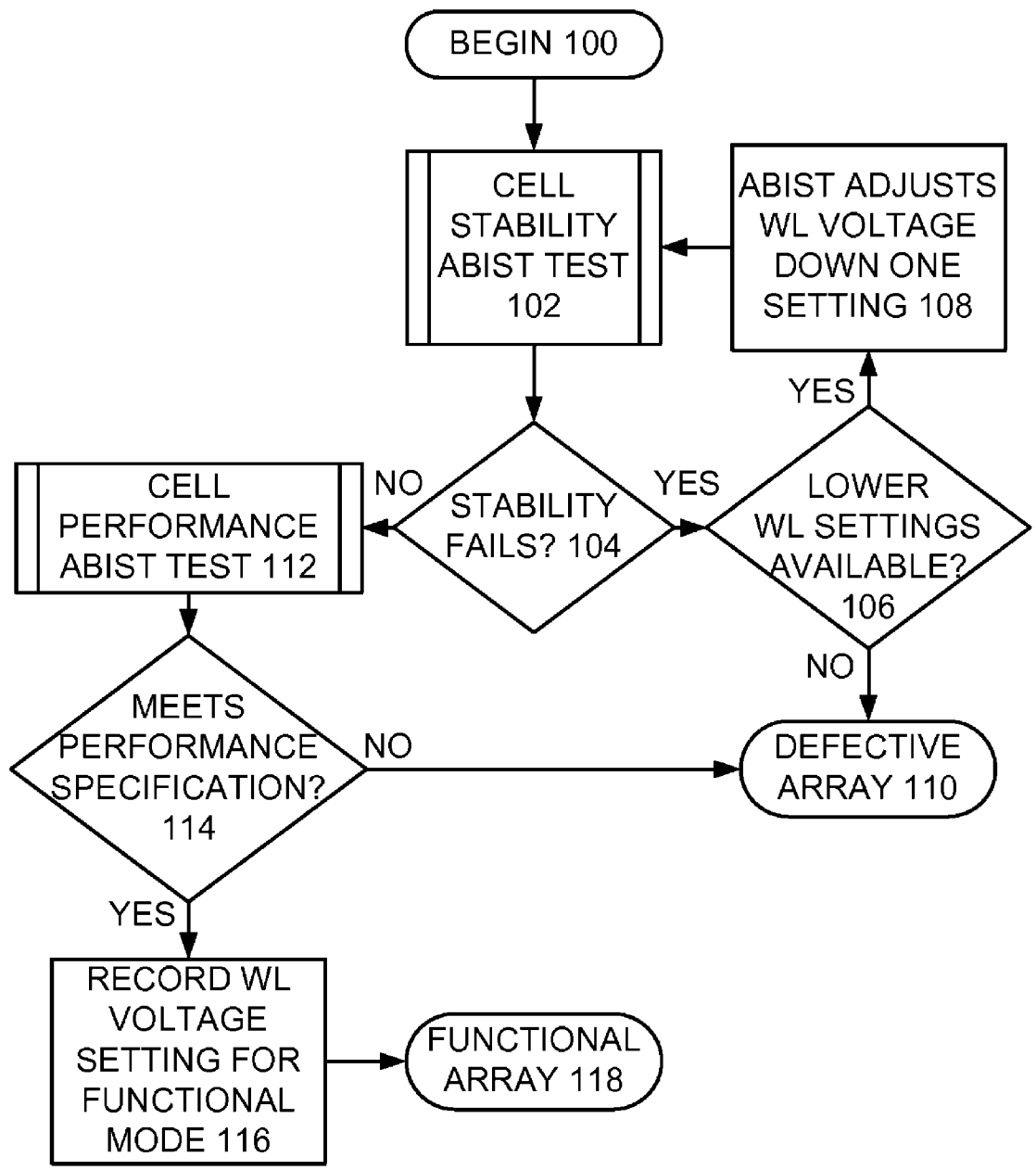
FIG. 1 is flow chart illustrating an array built-in self-test (ABIST) method in accordance with the preferred embodiment.

Having reference now to the drawings, in FIG. 1, there are shown exemplary steps of an array built-in self-test (ABIST) method in accordance with the preferred embodiment starting at a block 100. The ABIST method is provided using a static random access memory (SRAM) circuit, for example, as illustrated and described with respect to FIG. 2.

Cell stability ABIST patterns are run starting with a maximum wordline voltage as indicated at a block 102. Checking for any stability fails is performed as indicated at a decision block 104. Responsive to any identified stability fails, checking for a lower wordline voltage being available is performed as indicated at a decision block 106.

When a lower wordline voltage is available, then the wordline voltage is adjusted to the next lower level as indicated at a block 108 and cell stability ABIST patterns are run. When no lower wordline voltage settings are available, the array is identified as defective as indicated at a block 110. When no stability fails are identified, as indicated at a block 112 cell performance ABIST test patterns are run and cell performance checking is performed as indicated at a decision block 114. Responsive to the cell meeting performance with no stability or other ABIST fails, the wordline voltage level setting is recorded as indicated at a block 116. As indicated at a block 118, the wordline voltage level setting is used in a functional mode for the identified functional array.

Figure 2:
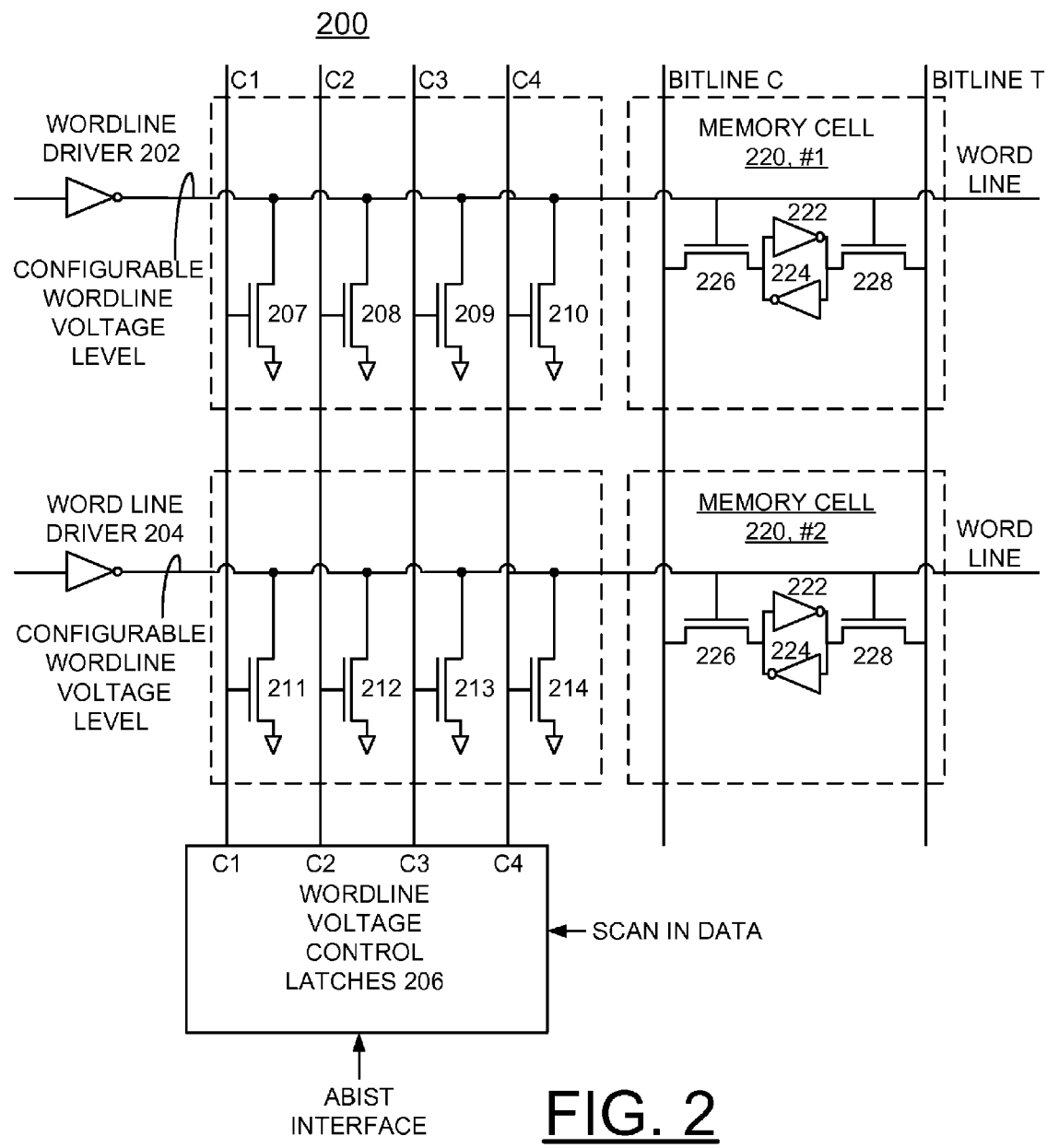
FIG. 2 is a static random access memory (SRAM) circuit for implementing enhanced static random access memory (SRAM) stability and enhanced chip yield using configurable wordline voltage levels in accordance with the preferred embodiment.

Referring also to FIG. 2, there is shown a static random access memory (SRAM) circuit for implementing enhanced static random access memory (SRAM) stability and enhanced chip yield using configurable wordline voltage levels generally designated by the reference character 200 in accordance with the preferred embodiment. SRAM circuit 200 includes a respective wordline driver 202, 204 connected to a respective wordline, each having a configurable wordline voltage level.

SRAM circuit 200 includes a plurality of wordline voltage control latches 206 having an ABIST interface for running ABIST tests and a scan in data input for receiving the wordline voltage level setting recorded at block 116. SRAM circuit 200 includes a plurality of weak N-channel field effect transistors (NFETs) 207-214. As shown, four weak NFET pulldown devices 204-210, and 211-214 are connected in parallel groups to a respective wordline. The wordline voltage control latches 206 provide a respective control signal gate input to the respective weak NFET pulldown devices 204-210, and 211-214, indicated at outputs C1, C2, C3, and C4.

SRAM circuit 200 includes a pair of memory SRAM cells 220, #1, #2, each connected to a respective wordline. Each of the memory SRAM cells 220, #1, #2 is, for example, a conventional six-transistor (6T) static random access memory (SRAM) cell, as shown in FIG. 2. The SRAM cell 220 includes four transistors defining a pair of parallel reverse polarity connected inverters 222, 224 for storing data, a pair of N-channel field effect transistors (NFETs) 226, 228 having a wordline gate input and respectively connected to a respective side of the static latch and a respective one of a bit line pair BITLINE C, BITLINE T. NFETs 226, 228 are passgate devices. Controlling the maximum wordline voltage adjusts the strength of the SRAM pass gates 226, 228, thus increasing SRAM cell stability, while lowering SRAM cell performance.

The wordline voltage level setting recorded at block 116 of FIG. 1 is scanned into control latches 206 of the SRAM circuit 200 at startup. This setting controls the number of active pulldown devices 204-210, and 211-214 and thus the maximum wordline voltage. The control signal input is applied to the gate of the weak NFET pulldown devices 204-210, and 211-214, with only one wordline typically activated at a time. When the weak NFET pulldown devices 204-210, and 211-214 are activated, the maximum wordline voltage is limited. Because the NFET pulldown devices 204-210, and 211-214 are weak and only one wordline is typically activated at a time, the leakage associated with turning on a wordline is not significant.

It should be understood that the present invention is not limited to the illustrated SRAM circuit 200. For example, the implementation shown uses 4 weak pulldown devices per wordline, but a variable number of pulldown devices can be used to provide more or less granularity in the wordline voltage levels.

Figure 3:
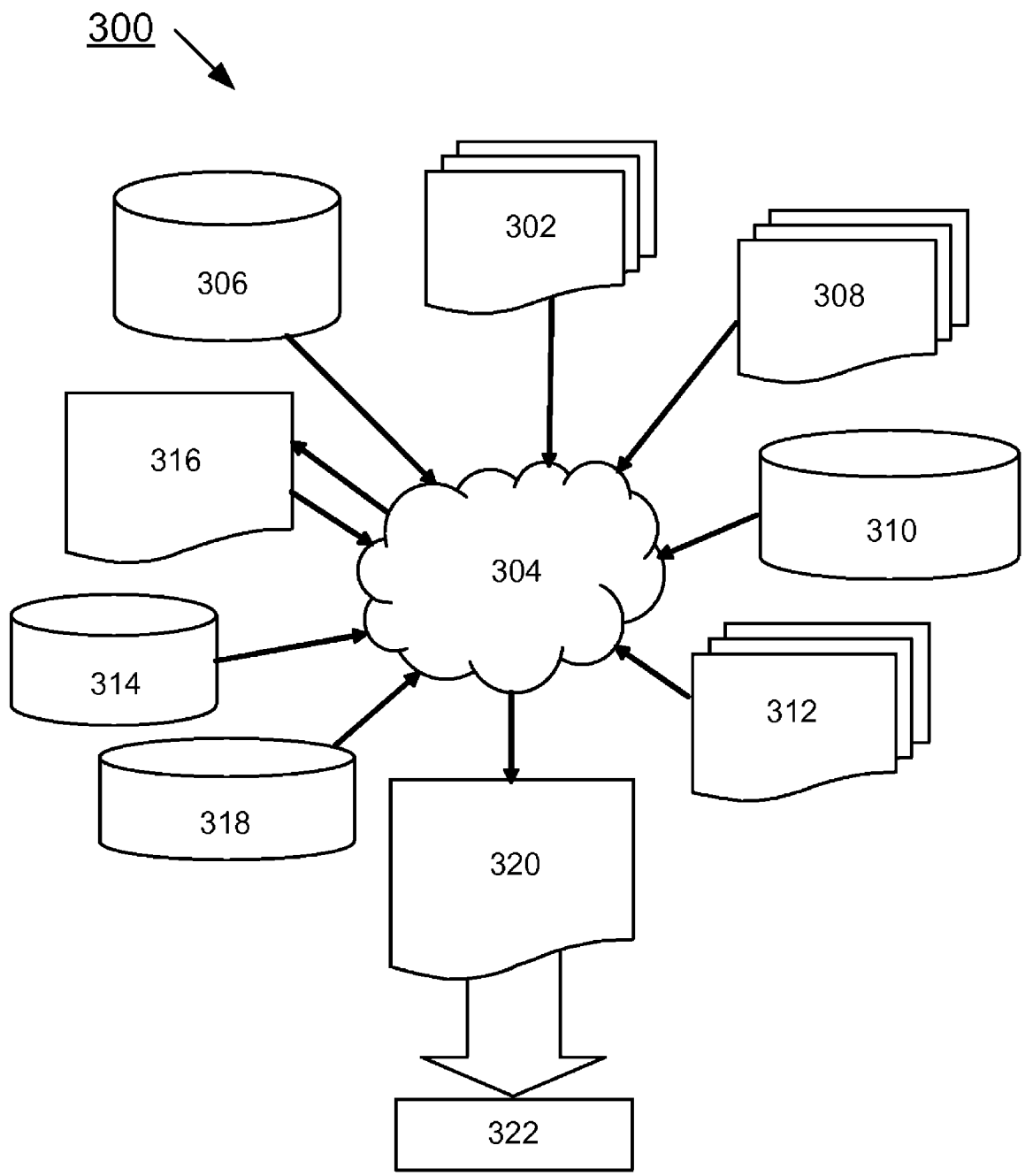
FIG. 3 is a flow diagram of a design process used in semiconductor design, manufacturing, and/or test.

FIG. 3 shows a block diagram of an example design flow 300. Design flow 300 may vary depending on the type of IC being designed. For example, a design flow 300 for building an application specific IC (ASIC) may differ from a design flow 300 for designing a standard component. Design structure 302 is preferably an input to a design process 304 and may come from an IP provider, a core developer, or other design company or may be generated by the operator of the design flow, or from other sources. Design structure 302 comprises circuit 200 in the form of schematics or HDL, a hardware-description language, for example, Verilog, VHDL, C, and the like. Design structure 302 may be contained on one or more machine readable medium. For example, design structure 302 may be a text file or a graphical representation of circuit 200. Design process 304 preferably synthesizes, or translates, circuit 200 into a netlist 306, where netlist 306 is, for example, a list of wires, transistors, logic gates, control circuits, I/O, models, etc. that describes the connections to other elements and circuits in an integrated circuit design and recorded on at least one of machine readable medium. This may be an iterative process in which netlist 306 is resynthesized one or more times depending on design specifications and parameters for the circuits.

Design process 304 may include using a variety of inputs; for example, inputs from library elements 303 which may house a set of commonly used elements, circuits, and devices, including models, layouts, and symbolic representations, for a given manufacturing technology, such as different technology nodes, 32 nm, 45 nm, 90 nm, and the like, design specifications 310, characterization data 312, verification data 314, design rules 316, and test data files 313, which may include test patterns and other testing information. Design process 304 may further include, for example, standard circuit design processes such as timing analysis, verification, design rule checking, place and route operations, and the like. One of ordinary skill in the art of integrated circuit design can appreciate the extent of possible electronic design automation tools and applications used in design process 304 without deviating from the scope and spirit of the invention. The design structure of the invention is not limited to any specific design flow.

Design process 304 preferably translates an embodiment of the invention as shown in FIG. 2 along with any additional integrated circuit design or data (if applicable), into a second design structure 320. Design structure 320 resides on a storage medium in a data format used for the exchange of layout data of integrated circuits, for example, information stored in a GDSII (GDS2), GL1, OASIS, or any other suitable format for storing such design structures. Design structure 320 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 2. Design structure 320 may then proceed to a stage 322 where, for example, design structure 320 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A static random access memory (SRAM) circuit comprising:
   a SRAM memory cell;
   a wordline connected to said SRAM memory cell;
   a plurality of wordline voltage pulldown devices connected to the wordline
   a respective wordline voltage control input signal applied to each of said plurality of wordline voltage pulldown devices to selectively adjust the voltage level of the wordline; and
   said plurality of wordline voltage pulldown devices includes weak N-channel field effect transistors (NFETs).

2. The SRAM circuit as recited in claim 1, wherein said SRAM memory cell includes a static latch formed by a pair of parallel reverse polarity connected inverters for storing data.

3. The SRAM circuit as recited in claim 1, wherein said SRAM memory cell includes a pair of passgate N-channel field effect transistors (NFETs) having a wordline gate input and respectively connected to a respective side of the static latch and a respective one of a bit line pair.

4. The SRAM circuit as recited in claim 1, includes a plurality of wordline voltage control latches having an ABIST interface for running ABIST tests and an input for receiving a wordline voltage level setting.

5. The SRAM circuit as recited in claim 4, wherein said plurality of wordline voltage control latches provides said respective wordline voltage control input.

6. The SRAM circuit as recited in claim 1, includes a plurality of wordline voltage control latches, said plurality of wordline voltage control latches providing a respective gate input to said weak N-channel field effect transistors (NFETs).

7. An Array Built In Self Test (ABIST) method used with a static random access memory (SRAM) circuit including a SRAM memory cell, a wordline connected to said SRAM memory cell, and a configurable wordline voltage level, said ABIST method comprising the steps of:
running cell stability ABIST patterns starting with a maximum wordline voltage;
responsive to identifying stability fails, adjusting the wordline voltage level to the next lower level;
running cell stability ABIST patterns with the adjusted lower wordline voltage level;
responsive to no identified stability fails, checking cell performance ; and
responsive to the cell meeting performance, using the wordline voltage level setting in a functional mode of the SRAM memory cell.

8. The ABIST method as recited in claim 7 wherein adjusting the wordline voltage level to the next lower level includes providing a plurality of wordline voltage pulldown devices connected to the wordline.

9. The ABIST method as recited in claim 8 further includes providing a respective wordline voltage control input signal applied to each of said plurality of wordline voltage pulldown devices to selectively adjust the voltage level of the wordline.

10. The ABIST method as recited in claim 8 includes providing a respective weak N-channel field effect transistor (NFET) to implement said plurality of wordline voltage pulldown devices.

11. The ABIST method as recited in claim 10 further includes providing a respective wordline voltage control input signal applied to a respective gate of each said respective weak N-channel field effect transistor (NFET).

12. The ABIST method as recited in claim 7 includes providing a six-transistor (6T) static random access memory (SRAM) cell for said SRAM cell.

13. The ABIST method as recited in claim 7 includes providing said SRAM cell including a pair of passgate N-channel field effect transistors (NFETs) having a wordline gate input.

14. The ABIST method as recited in claim 7 includes providing a plurality of wordline voltage control latches having an ABIST interface for running the ABIST tests and an input for receiving a wordline voltage level setting.

15. A design structure embodied in a machine readable medium used in a design process, the design structure comprising:
a static random access memory (SRAM) circuit tangibly embodied in the machine readable medium used in the design process, said SRAM circuit for implementing enhanced SRAM stability, said SRAM circuit including
a SRAM memory cell;
a wordline connected to said SRAM memory cell;
a plurality of wordline voltage pulldown devices connected to the wordline; and
a respective wordline voltage control input signal applied to each of said plurality of wordline voltage pulldown devices to selectively adjust the voltage level of the wordline, wherein the design structure comprises a netlist, which describes said SRAM circuit, and wherein the design structure, when read and used in the manufacture of a semiconductor chip produces a chip comprising SRAM circuit.

16. The design structure of claim 15, wherein the design structure resides on storage medium as a data format used for the exchange of layout data of integrated circuits.

17. The design structure of claim 15, wherein the design structure includes at least one of test data files, characterization data, verification data, or design specifications.

18. The design structure of claim 15, wherein said plurality of wordline voltage pulldown devices includes weak N-channel field effect transistors (NFETs), and includes a plurality of wordline voltage control latches, said plurality of wordline voltage control latches providing a respective gate input to said weak N-channel field effect transistors (NFETs).

* * * * *